United States Patent [19]

Hamaguchi et al.

[11] Patent Number: 4,838,654
[45] Date of Patent: Jun. 13, 1989

[54] LIQUID CRYSTAL DISPLAY DEVICE HAVING DISPLAY AND DRIVER SECTIONS ON A SINGLE BOARD

[75] Inventors: Tsueno Hamaguchi; Yoshihiko Hirai; Setsuo Kaneko, all of Tokyo, Japan

[73] Assignee: NEC Corporation, Japan

[21] Appl. No.: 109,227

[22] Filed: Oct. 16, 1987

[30] Foreign Application Priority Data

Oct. 17, 1986 [JP] Japan ................... 61-246653

[51] Int. Cl.[4] .................. G02F 1/13; G09G 3/18; G09G 3/36
[52] U.S. Cl. .................... 350/333; 350/332; 340/784; 340/765
[58] Field of Search ............ 350/332, 333; 340/784, 340/765

[56] References Cited

U.S. PATENT DOCUMENTS

| Re. 28,891 | 7/1976 | Borel et al. ............. 350/344 |
| 4,368,523 | 1/1983 | Kawate ................... 350/333 |
| 4,644,338 | 2/1987 | Aoki et al. .............. 350/334 |
| 4,654,117 | 3/1987 | Aoki et al. .............. 350/339 R |
| 4,728,172 | 3/1988 | Cannella ................. 350/333 |

Primary Examiner—Stanley D. Miller
Assistant Examiner—Huy Kim Mai
Attorney, Agent, or Firm—Laff, Whitesel, Conte & Saret

[57] ABSTRACT

A liquid crystal display device includes first board having a reference voltage electrode on one surface, a second board having, on a main surface, a lattice of conductive stripes, a plurality of pairs of a transistor and a picture element electrode, each pair being disposed at each crossing point of the conductive stripes and the transistors being thin film transistors using polycrystalline or amorphous silicon, and a driving circuit for driving the conductive stripes, the driving circuit being formed in a monocrystalline silicon in a form of semiconductor integrated circuit directly connected to the conductive stripes, and a liquid crystal interposed between the one surface of the first board and the main surface of the second board.

5 Claims, 2 Drawing Sheets

LIQUID CRYSTAL DISPLAY DEVICE HAVING DISPLAY AND DRIVER SECTIONS ON A SINGLE BOARD

DESCRIPTION OF THE BACKGROUND

1. Field of the Invention:

The present invention relates to a liquid crystal display (hereinafter, referred to LCD) device, and more particularly to a structural improvement of the same device.

2. Description of the Related Art:

In recent years, LCD devices using liquid crystal such as twisted nematic (TN) liquid crystal have been developed to an extent of commercial use in some industrial fields including wrist watches, disk-top calculators and so on. For TV display devices, word-processors and other information display devices, active-matrix type LCD devices attract many attentions. Those active-matrix type LCD devices are composed of a first board having a plane electrode held at a reference potential, a second board of transparent material on which there provides a lattice of conductive stripes and a pair of thin film transistor (TFT) and picture element electrode at each crossing point of the conductive stripes, and a liquid crystal interposed between the first and second boards. The TFT's are insulated gate field effect transistors having polycrystalline silicone or amorphous silicon at a channel portion between source and drain regions.

For improving the quality of produced picture on the active-matrix type LCD devices, it is necessary to increase the density of picture elements, causing an increment of the conductive stripes to be scanned. The scanning signals are produced with semiconductor integrated circuit (IC) which is formed in a monocrystalline silicon substrate. The IC is difficult to be formed with use of the polycrystalline or amorphous silicon, due to their crystal imperfection.

The LCD device and the IC for driving the LCD are separately formed and wired therebetween. However, in the LCD device having picture elements of 400×600, there are 400 conductive stripes in a vertical direction and 640 conductive stripes in a horizontal direction. Thus, 1,040 interconnections are required in one display apparatus.

Although the interconnections are formed by wire-bonding process, the 1,040 or more interconnections increase a probability of connection errors and rise a production cost. Technically, such large number of interconnections on a small area is an upper limit of present connection technique.

The LCD device in which an LCD panel and a driving circuit are integrated on a single board has been proposed on pages 48 to 49 of "Society for Information Display, International Symposium, Digest of Technical Papers, 82" (referred to "SID 82 DIGEST") and on pages 316 to 319 of "Society for Information Display, International Symposium, Digest of Technical papers, 84" (referred to "SID 84 DIGEST"). The SID 82 DIGEST formed both of LCD panel and driving circuit on a monocrystalline silicon substrate. The monocrystalline silicon substrate is not a transparent material. The proposed LCD device is not used as a light transmission type device. Even in a case using as a light reflection type device, the produced picture has a poor contrast. The SID 84 DIGEST formed both of them on a glass substrate using polycrystalline silicon. The driving circuit is formed of TFT's using polycrystalline silicon and has a limited low operating frequency. The reproduced picture is not stable. The reproduced picture quality is insufficient for commercial use. Furthermore, it is difficult to form the driving circuit into a small area to miniaturize the LCD device.

SUMMARY OF THE INVENTION

It is, therefore, a major object of the present invention to provide an LCD device formed in an integrated form on a single board and requiring a small number of external connections It is another object of the present invention to provide an LCD device producing a picture of improved quality.

According to the present invention, there is provided an LCD device comprising a first board having a reference voltage electrode, a second board having a lattice of conductive stripes, a pair of transistor and picture element electrode at each crossing point of the conductive stripes and a driving circuit applying signals to the conductive stripes and liquid crystal interposed between the first and second boards, at least one of first and second board being formed of transparent material, the transistor including polycrystalline or amorphous semiconductor as a channel region, the driving circuit being formed on a monocrystalline semiconductor and the conductive stripes and the driving circuit being interconnected on the second board by conductive layers without using bonding wire.

The LCD device of the present invention forms the driving circuit on the second board together with the conductive stripes and the pairs of transistor and picture element electrode and interconnects the driving circuit and the conductive stripes by using the conductive layers. Those interconnections are easily achieved by IC process. The number of external connections becomes small, because the driving signals are formed on the second board. Thus, the high density wire-bondings are not required, causing a small probability of bonding error, a decrease of production cost and an easiness of production technique.

BRIEF DESCRIPTION OF DRAWINGS

The above and further objects, features and advantages of the present invention will become more apparent from the following description taken in conjunction with the accompanying drawings, wherein.

DESCRIPTION OF THE PREFERRED EMBODIMENT

Figure 1:
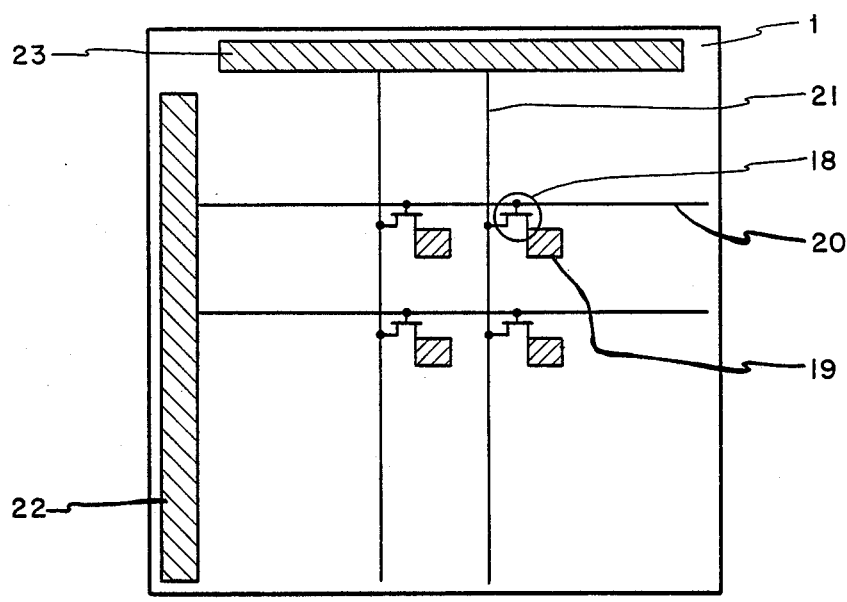
FIG. 1 is a brief plan view of a preferred embodiment according to the present invention.
Figure 2:
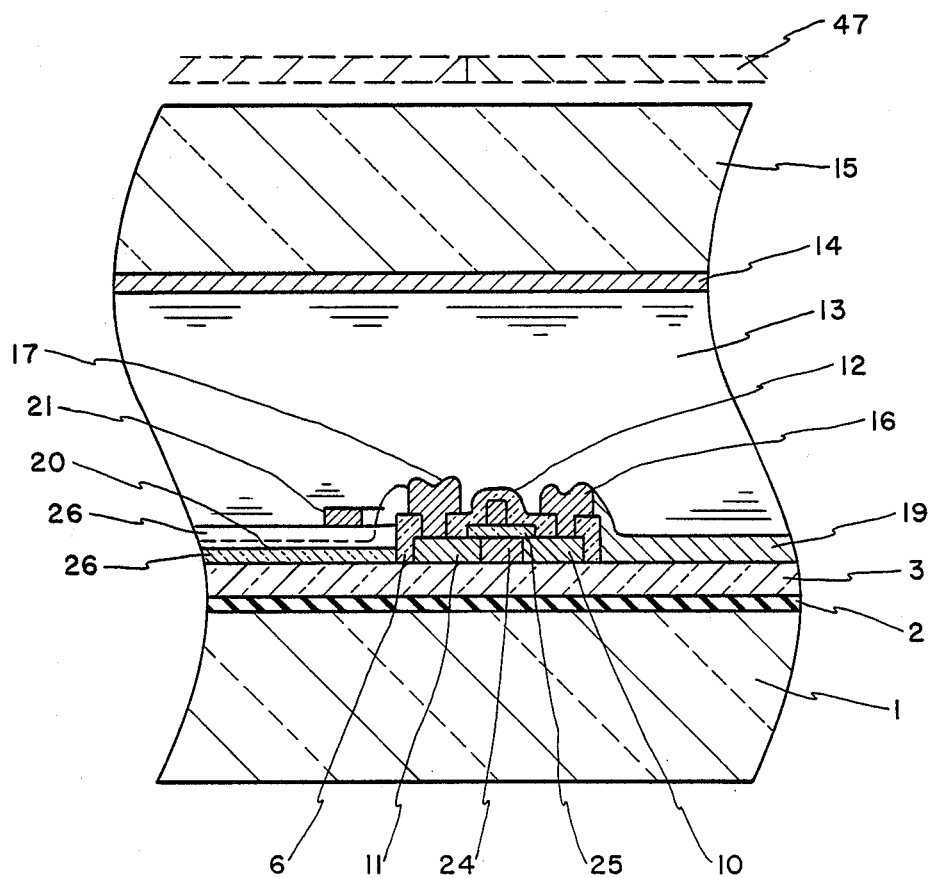
FIG. 2 is a partial section view of encircled portion in FIG. 1 for explaining a pair of transistor and picture element electrode.

An LCD device of the preferred embodiment has a transparent board 1 of quartz glass, borosilicate glass and so on, a common electrode board 15 of the transparent glass such as quartz glass, borosilicate glass and so on and liquid crystal layer 13 such as twisted nematic liquid crystal interposed between the transparent board 1 and the common electrode board 15 (see FIG. 2). The common electrode board 15 provides a common electrode 14 in contact with the liquid crystal layer 13. A reference voltage is applied to the common electrode 14. The plan view of the transparent board 1 is shown in FIG. 1. The TFT's 18 and picture element electrodes 5 are formed on the transparent board 1 so as to face the liquid crystal. A plurality of scan electrode stripes 20 and a plurality of data electrode stripes 21 are provided on the transparent board 1 to form a lattice. Pairs of the TFT 18 and the picture element electrode 5 are disposed at respective crossing points of the scan and data electrode stripes 20 and 21. The transparent board 1 also provides a driving circuit 22 of the scan electrode stripes 20 and another driving circuit 23 of the data electrode stripes 21. Those driving circuit 22 and 23 are formed in a form of MOS IC in which a plurality of MOS (Metal-Oxide-Semiconductor) field effect transistors are formed on a monocrystalline silicon substrate and wired to form the respective driving circuits. Such driving circuits are schematically demonstrated in FIGS. 3 and 4 and will be explained later. The liquid crystal layer 13 is preferably interposed between the common electrode 14 and a part of the transparent board 1, except for the driving circuits 22 and 23. However, layer 13 may also be interposed between the common electrode 14 and the entire surface of the transparent board 1. In the later case, the image can be displayed in the part of layer 13, except for the driving circuits 22 and 23, regardless of the liquid crystal layer on the driving circuits 22 and 23.

One TFT 18 and its peripheral portion are schematically shown in FIG. 2. A silicon dioxide layer 3 is attached on a surface of the transparent substrate 1 with a binder 2 such as epoxy resin or polyimide. A plurality of polycrystalline silicon 24 are formed on the silicon dioxide layer 3 so as to form a matrix. Amorphous silicon or other semiconductor may be replaced with the polycrystalline silicon 24. However, in order to form the TFT's 18 and the driving circuit 22 and 23 of MOS IC with a common process, the use of polycrystalline silicon is more preferable. Gate electrodes 12 are formed on central portion of the polycrystalline silicons 24 through gate insulator films 25. Impurity atoms are diffused into the polycrystalline silicons 24 on both sides of the gate electrodes 12 to form source regions 11 and drain regions 10. The gate electrodes 12, the gate insulator films 25 and the polycrystalline silicons 24 including the source regions 11 and the drain regions 10 are covered with silicon dioxide layers 6 having electrode lead-out openings. Through the openings, source and drain electrodes 17 and 16 are led out. The source electrodes 17 are connected to the scan electrode stripes 20. The gate electrodes 12 are connected to the data electrode stripes 21. The drain electrodes 16 are connected to picture element electrodes 19. The scan electrode stripes 20 run along the horizontal direction of FIG. 2. The data electrode stripes 21 run in a direction perpendicular to the drawing of FIG. 2. The data electrode stripes 21 overlay the scan electrode stripes 20 through a silicon oxide film 26 to cross the scan electrode stripes 20. The electrode stripes 20 and 21 are formed of metallized aluminum, impurity doped polycrystalline or other conductive layer formed on the silicon dioxide layer 3 and are directly connected to the driving circuits 22 and 23. The picture element electrodes 19 are made of transparent conductor such as indium tin oxide (ITO).

Figure 3:
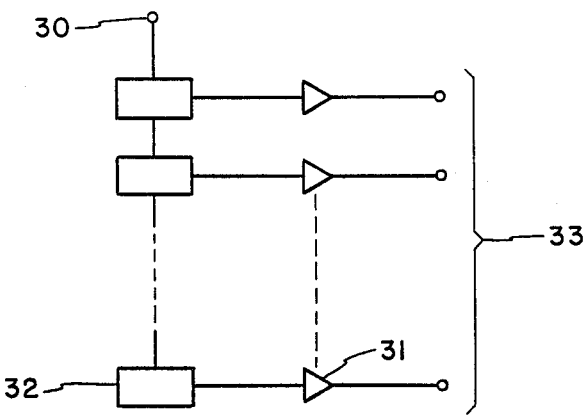
FIG. 3 is a brief circuit diagram showing a driving circuit for scanning the lattice of conductive stripes.

The driving circuit 22 of the scan electrode stripes 20 is composed of a shift-register 32 and a plurality of output drivers 31, as shown in FIG. 3. A vertical synchronizing signal is applied to the shift-register 32 through an input terminal 30. From each stage of the shift-register 32, scan pulses are derived and applied to the respective output drivers 31. The scan pulses are applied to the scan electrode stripes 20 through the output terminals 33.

Figure 4:
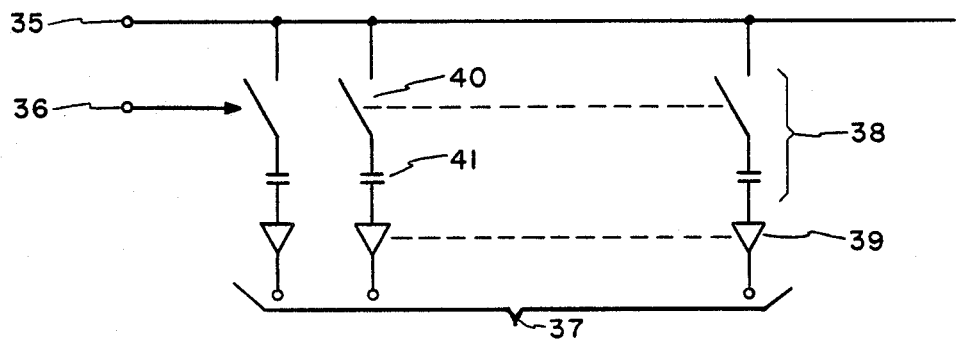
FIG. 4 is a brief circuit diagram showing another driving circuit for applying data signals to the lattice of conductive stripes.

The driving circuit 23 of the data electrode stripes 21 is composed of a plurality of sample-hold circuits 38 and output drivers 39, as shown in FIG. 4. Each of the sample-hold circuits includes a switch 40 and a capacitor 41. The switches 40 are sequentially turned on by a horizontal synchronizing signal applied to the input terminal 36. The sequential turning-on may be achieved by using another shift-register shifting the horizontal synchronizing signal. A video signal data applied to the input terminal 35 is sampled in the capacitors 41 by sequentially turning on the switches 40. The sampled data are amplified by the output drivers 39 and then applied to the data electrode stripes 21 through the output terminals 37.

The above-explained LCD device provides a matrix of picture elements and driver circuits 22 and 23 on a common board 1. Therefore, interconnections between the scan electrode stripes 20 and the driver circuit 22 and between the data electode stripes 21 and the driver circuit 23 are performed on the board 1 by using IC process. The number of interconnections and the density of interconnections are no longer reasons for decreasing yield and increasing cost. Such integrated device requires small number of external terminals. Indispensable terminals are those for vertical and horizontal synchronizing signals and for video signal in addition to power supply terminals. Clock signal terminal may be avoided, if a clock generator is formed in the driving circuits 22 and 23. Thus, the assembling process of the LCD device into an LCD apparatus becomes easy.

The LCD device of the preferred embodiment uses polycrystalline silicon for TFT's in LCD panel and monocrystalline silicon for driving circuits. The LCD panel is usable as light transmission type device. In using the LCD panel as light reflection type, a light reflection board having a sufficient reflection coefficient may be used to reflect the light transmitted through the LCD panel. In both usage, a reproduced picture having a superior quality of contrast can be obtained. Furthermore, the driving circuits 22 and 23 are formed in MOS IC's having sufficiently high operating frequency. The LCD panel can be driven in a high scanning frequency to obtain a stable picture.

Additionally, since the LCD panel including the TFT's 18, picture element electrodes 5 and the scan and data electrode stripes 20 and 21 and the driving circuit 22 and 23 are integrated, those can be formed in a single manufacturing process. The manufacture of the LCD device is not difficult and decreases the total manufacturing process. An example of such manufacturing process will be next explained with reference to FIGS. 5 to 7.

Figure 5:
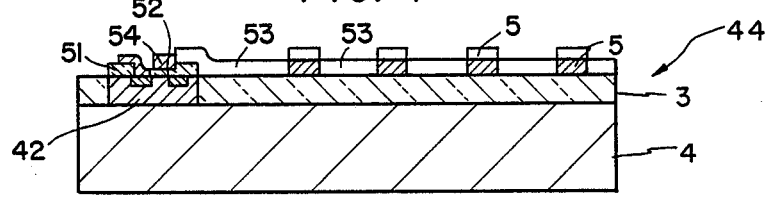
FIGS. 5 to 7 are sectional views for explaining steps of manufacturing the preferred embodiment of the present invention.

Referring to FIG. 5, a surface of monocrystalline silicon substrate 4 is selectively oxidized so as to form a silicon dioxide layer 3 of about 2 $\mu$m except portions 42 in which driving circuits 22 and 23 are to be formed.

Since thus formed silicon dioxide layer 3 has a thickness slightly thicker than the un-oxidized monocrystalline silicon portions, monocrystalline silicon is selectively grown on the un-oxidized portion by CVD process to equalize the thicknesses of the silicon dioxide layer 3 and the monocrystalline silicon portions 42. Thereafter, usual process for forming the MOS IC is followed. That is, the surfaces of the monocrystalline silicon portions 42 are oxidized to form thick field oxide film 51. Selective etching is applied to the field oxide film 51 to expose selective areas of the monocrystalline portions 42 in which MOS FET's are to be formed. The exposed areas are re-oxidized to form gate oxide film. Polycrystalline silicon is depositted on the whole surface of the field and gate oxide films 52 and the silicon dioxide layer 3 and is subjected to a selective etching process to leave on regions on which TFT's 18 and gate electrodes 54 in MOS IC's are to be formed. After the gate oxide film 25 is formed on the polycrystalline silicon for TFT's 18, polycrystalline is further formed on the gate oxide film 25 to form gate electrodes 12 for TFT's 18. Impurity ion implantation process is followed to form source and drain regions of MOS FET's and TFT's 18. The polycrystalline silicons of TFT's are covered with silicon dioxide film 6 having openings for electrode connection. Then, ITO is formed on the silicon dioxide layer 3 adjacent to the TFT's 18 as picture element electrodes 19. Aluminum is evaporated on the whole surface and is selectively etched to form wirings of MOS IC's, the scan electrode stripes 20 (53 in FIG. 5), connections between the MOS IC of the driver circuit 22 and the scan electrode stripes 20, source electrodes 17 of TFT's 18 being connected to the scan electrode stripes 20 and drain electrodes 16 of the TFT's 18 being connected to the picture element electrodes 19. After the scan electrode stripes 20 are covered with the oxide film 26, aluminum is evaporated again and selectively etched to form the data electrode stripes 21 (5 in FIG. 5) crossing the scan electrode stripes 20 and connecting to the gate electrodes 12 of TFT's 18 and MOS IC of the driver circuit 23. Thus, a semiprocessed substrate 44 of FIG. 5 is obtained.

Figure 6:
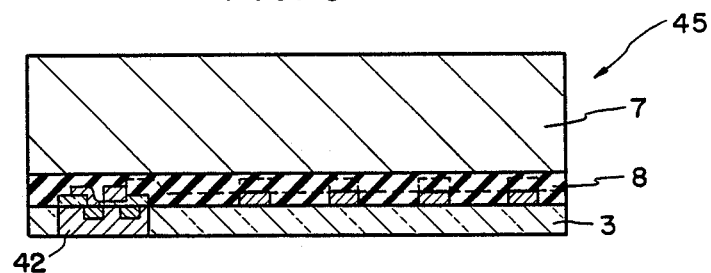

Next, a silicon wafer 7 is attached on the element-formed surface of the semiprocessed substrate 44 with a binder such as epoxy resin or polyimide. The monocrystalline silicon substrate 4 is etched away by mechanical-chemical etching process using organic amine, to form a second semiprocessed substrate 45, as shown in FIG. 6. The organic amine does not resolve silicon oxide. Therefore, the etching process using organic amine stops etching at the bottom of the silicon dioxide layer 3. Thus, precise control of the etching can be achieved. The silicon wafer 7 operates only as a holder of the semiprocessed substrate 44 for the etching process and may be substituted with any suitable material.

Figure 7:
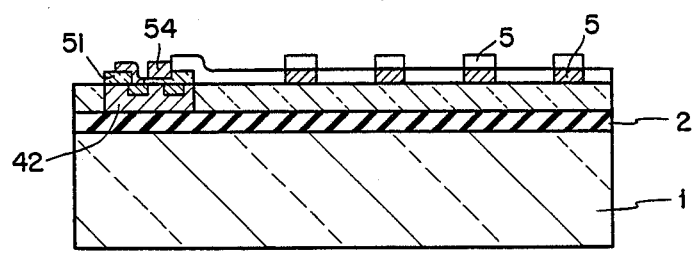

The etched surface of the second semiprocessed substrate 45 is attached to a transparent board 1 of quartz glass or borosilicate glass with a binder 2 of epoxy resin or polyimide. Thereafter, the silicon wafer 7 is removed by grinding or etching. The binder 8 is burned out by plasma reaction, to expose the elementformed surface, as shown in FIG. 7.

The exposed surface of thus formed board is placed to face the common electrode 14 of the common electrode board 15. The common electrode 14 is formed of transparent conductor such as ITO and is formed on whole surface of the common electrode board 15 of transparent material such as quartz glass or borosilicate glass. Bubbing process is preliminary subjected to both boards for orientation treatment. Usually, polyimide film is used for the orientation treatment. TN type liquid crystal is inserted into the space between the common electrode 14 and the element-formed surface of the transparent board 1.

When thus produced LCD apparatus was tested with a static drive, a constant ratio of 5:1 and a viewing angle of ±50° are obtained. Furthermore, similarly produced active-matrix LCD device having 400×600 picture elements and an element pitch of 0.05 mm were tested. Similar result to the case of the static drive was also obtained. The active-matrix was scanned with 2,000 lines per field. The result was also similar to the case of static drive. With use of the active-matrix LCD device, television picture was reproduced. The reproduced picture was high fidelity of half-tone reproduction and had a high contrast. Any defect of picture element was not found.

The number of terminals for external connection was reduced to 10 from 1040, compared to the LCD device having separate driving circuit. This reduction results in easy assemble of the LCD device by reducing the number of external connection process. LCD panel of thus produced LCD device was so small that it was suitable for a view finder of video camera. The LCD device was also suitable for using in projection display. A fine picture of 1 m×1 m was obtained. A fidelity of half-tone reproduction was satisfactory.

The LCD device of the present invention is applicable to either projection display or direct view display of either transmittive type or reflective type. As the projection display, light of xenon lamp is exposed to the LCD panel of the LCD device so that the transmitted light present an enlarged picture. Compared to the conventional LASER writing LCD panel, expensive LASER diode and its driving circuit may be eliminated. Miniaturization of the projection display can be achieved with low cost.

Although the present invention was explained with an embodiment of black-and-white display, the present invention is applicable to a color display by covering the outside surface of the common electrode board 15 with RGB color filter 47, as shown in FIG. 2 by dotted line. In a case of projection display, the color picture may be obtained by using three LCD device which are used for projecting red picture, green picture and blue picture, respectively.

What is claimed is:
1. A liquid crystal display device comprising:
   a first board made of a transparent material and having one surface;
   a common electrode formed on said one surface of said first board, said common electrode being made of a transparent conductor;
   a second board made of a transparent insulating material and having a main surface;
   an insulating layer formed on said main surface of said second board;
   a plurality of parallel disposed scan electrode stripes made of conductive layers and formed on said insulating layer;
   a plurality of parallel disposed data electrode stripes made of other conductive layers and formed on said insulating layer, said scan electrode stripes and said data electrode stripes being arranged orthogonally and made of conductive layers physically attached on said insulating layer;

a plurality of thin film insulated gate field effect transistors, each of said thin film transistors being disposed on said insulating layer at every crossing points of said scan and data electrode stripes, said thin film transistors being formed with a use of polycrystalline or amorphous semiconductor and each of said thin film transistors having a source electrode connected to an adjacent one of said data electrode stripes, a gate electrode connected to an adjacent one of said scan electrode stripes and a drain electrode;

a plurality of picture element electrodes made of a transparent conductor, each of said picture element electrodes being disposed on said insulating layer adjacent to a corresponding one of every one of the thin film transistors, said picture element electrodes being connected to an adjacent one of said drain electrodes;

first and second monocrystalline semiconductor layers having the same thickness as said insulating layer and formed on said main surface of said second board in contact with said insulating layer to form a substantially flat upper surface plane with said insulating layer, said first monocrystalline semiconductor layer forming a first driver circuit for driving said scan electrode stripes, said first driver circuit being a semiconductor integrated circuit directly connected to said scan electrode stripes by said conductive layers on said upper surface plane, said second monocrystalline semiconductor layer forming a second driver circuit for driving said data electrode stripes, said second driver circuit being a semiconductor integrated circuit directly connected to said data electrode stripes by said other conductive layers on said upper surface plane; and a liquid crystal interposed between said one surface of said first board and said main surface of said second board.

2. A liquid crystal display device as claimed in claim 1, wherein said polycrystalline or amorphous semiconductor is polycrystalline or amorphous silicon and said first and second monocrystalline semiconductor layers are made of monocrystalline silicon.

3. A liquid crystal display device as claimed in claim 2, wherein said insulating layer is made of silicon oxide.

4. A liquid crystal display device as claimed in claim 3, wherein said first and second driver circuits are formed in a form of MOS integrated circuit.

5. A liquid crystal display device as claimed in claim 4, said liquid crystal display device further comprising a color filter formed on the other surface of said first board opposite to said one surface.

* * * * *